United States Patent [19] [11] 4,419,813
Iwai [45] Dec. 13, 1983

[54] METHOD FOR FABRICATING SEMICONDUCTOR DEVICE

[75] Inventor: Hiroshi Iwai, Takaidonishi, Japan

[73] Assignee: Tokyo Shibaura Denki Kabushiki Kaisha, Kawasaki, Japan

[21] Appl. No.: 325,375

[22] Filed: Nov. 27, 1981

[30] Foreign Application Priority Data

Nov. 29, 1980 [JP] Japan .................. 55-168584
Nov. 29, 1980 [JP] Japan .................. 55-168585

[51] Int. Cl.³ .................................. H01L 21/225
[52] U.S. Cl. ........................... 29/576 W; 29/571; 29/580; 148/187; 148/188
[58] Field of Search ............... 29/576 W, 580, 571; 148/187, 188

[56] References Cited

U.S. PATENT DOCUMENTS 3,352,725 11/1967 Antell .................... 148/186
3,966,514 6/1976 Feng et al. .............. 148/175 X
3,985,597 10/1976 Zielinski ................. 156/11
4,016,017 4/1977 Aboaf et al. ............. 148/1.5 X
4,222,792 9/1980 Lever et al. ............. 29/576 W
4,224,089 9/1980 Nishimoto et al. ........ 148/188 X
4,233,091 11/1980 Kawabe .................... 29/576 W
4,348,802 9/1982 Shirato .................... 29/571

FOREIGN PATENT DOCUMENTS 55-72053 5/1980 Japan ..................... 29/576 W 1160744 8/1969 United Kingdom .

OTHER PUBLICATIONS

Patent Abstracts of Japan, vol. 2, No. 73, Jun. 7, 1978, p. 2847E78 for JP-A-53-39074.
Patent Abstracts of Japan, vol. 3, No. 22, Feb. 24, 1979, p. 35E93 for JP-A-54-589.
IBM Technical Disclosure Bulletin, vol. 21, No. 9, Feb. 1979, New York, Bhattacharyya et al., "Lift-Off Insulator Process," pp. 3577 and 3578.
IBM Technical Disclosure Bulletin, vol. 23, No. 3, Aug. 1980, New York, Horng et al., "Formation of Channel Stopper for Deep Trench Isolation", pp. 1034 and 1035.

Primary Examiner—G. Ozaki
Attorney, Agent, or Firm—Finnegan, Henderson, Farabow, Garrett & Dunner

[57] ABSTRACT

A method for forming an isolation region on a semiconductor substrate which comprises steps of forming first a groove in said substrate, filling the groove with a first insulating film in a manner which may inevitably leave a gap between the wall of the groove and the each side of the first insulating film, forming a second insulating film on the surface of said substrate including said groove, and removing a surface layer of said second insulating film thereby forming an isolation region in the groove filled completely with the first and second insulating films.

26 Claims, 19 Drawing Figures

METHOD FOR FABRICATING SEMICONDUCTOR DEVICE

BACKGROUND OF THE INVENTION

The present invention relates to a method for fabricating a semiconductor device and, more particularly, to an improvement in element isolation techniques of an LSI (large scale integrated circuit).

As an isolation technique of a semiconductor integrated circuit, a technique for facilitating higher packaging density and for facilitating a manufacturing process therefor is known wherein an isolation region comprises an oxide film which is formed by the selective oxidation technique. According to this method, an active region is surrounded by an oxide film, so that self-alignment is possible in base diffusion or the like, and a part required for mask alignment in the conventional method is unnecesary. For this reason, high packaging density in some degree may be achieved. However, with this method, since a thermally oxidized film is selectively buried in a silicon substrate, the substrate is distorted to a considerable extent. This degrades the electrical characteristics of the element and imposes strict limits on the structure, configuration, film thickness and selective oxidation conditions of the antioxidant mask and even the selection of the material for the substrate. This is discussed in various literature such as IEDM "High Pressure Oxidation for Isolation of High Speed Bipolar Devices", 1979, pp. 340 to 343.

In the conventional element isolation technique utilizing insulators, the field oxidation time is long, which adversely affects the diffusion and redistribution of impurities in the channel stopper. For example, when the diffusion in the transverse direction is too great, the effective channel width of the MOS transistor is reduced and the drain junction capacitance increases. This presents a big problem for achieving a high speed device.

Furthermore, since the antioxidant mask comprises a bi-layered structure consisting of a silicon nitride film and an oxide film, a bird's beak undercuts the silicon nitride film to a depth of 1 $\mu$m or more. Therefore, formation of an element isolation film of less than 2 $\mu$m width has been difficult. This is discussed, for example, in J.E.C.S., "Bird's Beak Configuration and Elimination of Gate Oxide Thinning Produced during Selection Oxidation", 1980, pp. 216 to 222.

Figure 1:
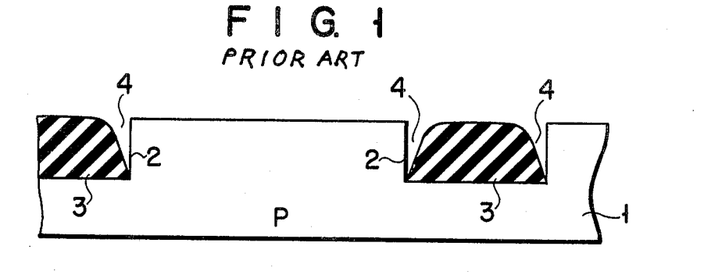
FIG. 1 is a sectional view showing a finished shape of a semiconductor element isolating layer manufactured according to a conventional method.

In order to overcome the defects of the element isolation technique utilizing selective oxidation, Japanese Laid-Open Patent application No. 50-11792 discloses a method according to which a mask is formed on a semiconductor substrate, a groove of a predetermined depth is formed by etching the substrate, an insulating film is formed by the CVD process to such a thickness that the groove is filled, and the mask is removed by etching or the like to simultaneously remove the insulating film on the mask, thereby leaving the insulating film only in the groove to provide an element isolation layer. This method has various advantages. Since the processing may be performed at a relatively low temperature, the substrate may not be adversely affected (the distortion due to high temperatures may be avoided), the bird's beak is not formed and transverse diffusion of the impurity layer as the channel stopper may be prevented. However, as shown in FIG. 1, an insulating film 3 as an element isolation layer in a groove 2 formed on a semiconductor substrate 1 cannot be formed completely flat, and gaps 4 are often formed between the insulating film 3 and the side walls of the groove 2.

The gaps 4 not only impair the element isolation function of the insulating film 3 but also impose problems in the subsequent steps for formation of the semiconductor element.

SUMMARY OF THE INVENTION

The present invention has been made in consideration of this and has for its object to provide a method for fabricating a semiconductor device which overcomes the drawbacks of the conventional method involving the selective oxidation method, which prevents the formation of gaps between the element region and the field region as in Japanese Laid-Open Patent application No. 50-11792, and which is capable of substantially completely flattening the element region and the field region.

In order to achieve this object, there is provided according to the present invention a method for fabricating a semiconductor device comprising the steps of:
(a) forming a pattern of a masking material on a semiconductor substrate, and forming a groove in said semiconductor substrate by using the patterned masking material as a mask;
(b) forming a first insulating film in said groove;
(c) forming a second insulating film on the surface of said semiconductor substrate including said groove; and
(d) forming an element isolation region substantially in said groove by removing a surface layer of said second insulating film.

DETAILED DESCRIPTION OF THE PREFERRED EMBODIMENTS

The preferred embodiment of the present invention will be described with reference to the case wherein it is applied to the manufacture of an n-channel MOS LSI. It should be noted however that this invention is also applicable to various kinds of semiconductor devices such as bipolar transistor, p-channel MOS, CMOS and etc.

Figure 2A:
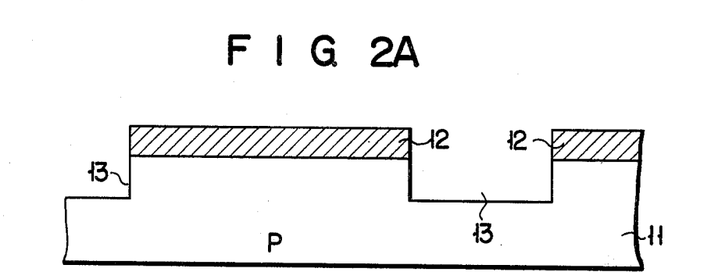
FIGS. 2A to 2G are sectional views showing steps in sequential order according to an embodiment of the method of the present invention.

(i) A masking material 12 such as a resist film (for example 1.5 $\mu$m in thickness) is deposited on a monocrystalline silicon semiconductor substrate (p-type, 10 $\Omega$.cm in specific resistance) 11 and patterned by photolithography or the like. Using the resist film 12 as a mask, etching is performed to form grooves 13 for example, 3 $\mu$m in width, 1 $\mu$m in depth (FIG. 2A).

In this case, it is possible to employ as the masking material Al film, silicon nitride film, or a bi-layered film consisting for example of SiO$_2$ and polycrystalline silicon. It is also possible as an etching method of the groove 13 to adopt a reactive ion etching or a conventional taper etching method.

Figure 2B:
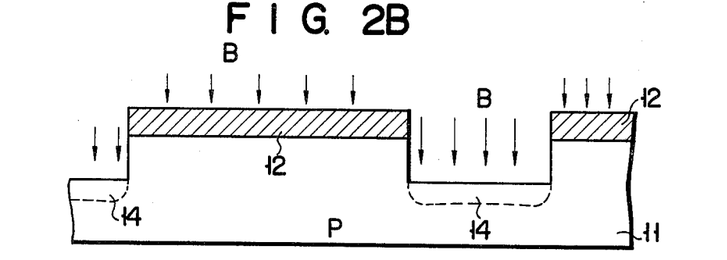

(ii) Using the masking material 12 as a mask, an impurity (e.g., boron) for preventing field inversion is implanted by, for example, ion implantation (accelerated voltage of 80 KeV, dosage of $5 \times 10^{12}$ cm$^{-2}$) to form a field channel stopper region 14 (FIG. 2B). The implantation of the impurity may be carried out after the following step (iii). Depending on conditions such as the initial impurity concentration of the substrate or the like, the implantation of the impurity is not always required and may therefore be omitted.

Figure 2C:
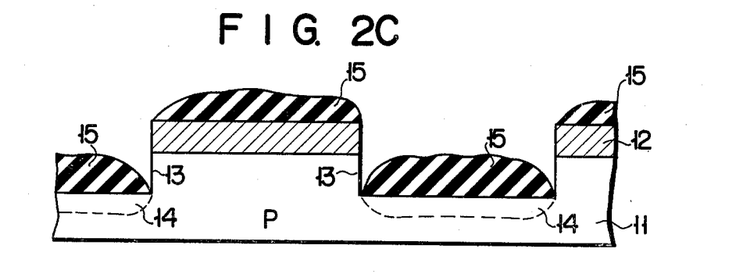

(iii) A first insulating film 15, 1 μm in thickness for example (e.g., Al$_2$O$_3$ film, SiO$_2$ film or the like) is formed by a conventional method such as chemical vapor deposition method or evaporation method (FIG. 2C).

Figure 2D:
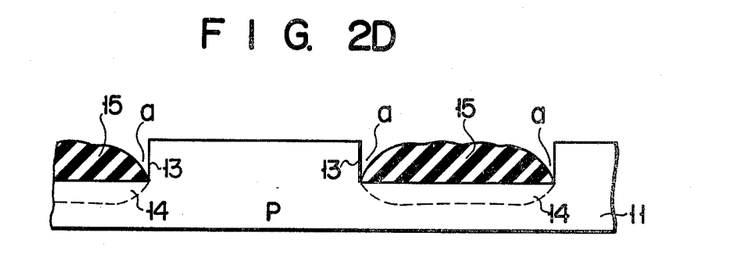

(iv) The masking material 12 is etched away with, for example, a mixed solution of H$_2$SO$_4$ and H$_2$O$_2$ to remove the first insulating film 15, leaving it substantially only in the grooves 13. As a result, as shown in FIG. 2D, a gap "a" (for example, 1 μm in depth, 1 μm in width at the uppermost portion of the gap) is formed between the insulating film 15 and each wall of the groove 13.

Figure 2E:
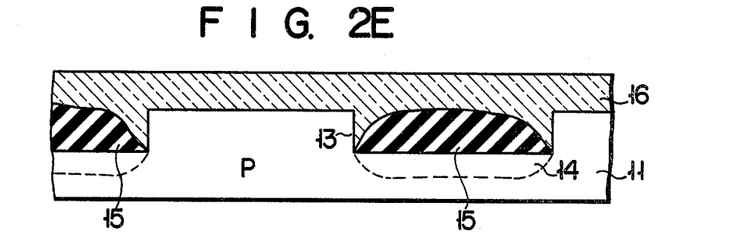

(v) A second insulating film comprising for example of a low melting point insulator 16 (e.g., boron phosphosilicate glass (BPSG)) 1 to 2 μm in thickness is formed on the entire surface of the semiconductor substrate 11 including the groove 13. The low melting point insulator 16 is then melted to fill in the gap "a" (FIG. 2E).

It is possible to employ instead of the low melting point insulator, other insulating materials such as polyimide, a spin-coated SiO$_2$, CVD SiO$_2$ or a resist material as a second insulating material. In the case of p-channel MOS LSI, phospho-silicate glass (PSG), arsenic silicate glass (AsSG) or the like may preferably be employed as a second insulating film.

It is also possible to employ as a second insulating film the same material as that of a first insulating film 15.

Figure 2F:
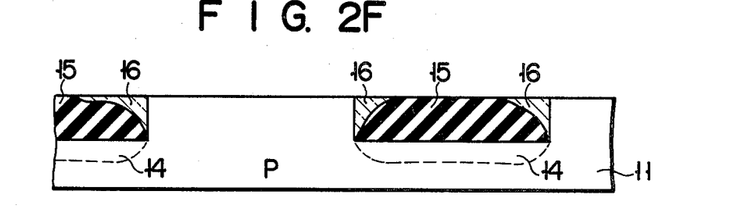

(vi) The entire layer of the low melting point insulator 16 is eteched until the upper surface of the semiconductor substrate 11 is exposed (FIG. 2F). As a result, it is possible to obtain in a simple process a semiconductor device provided with a flat field region (in general, insulative isolation region) having the insulating film 15 and the low melting point insulator 16 buried therein and with an element region whose top surface is flush with that of the field region.

Figure 2G:
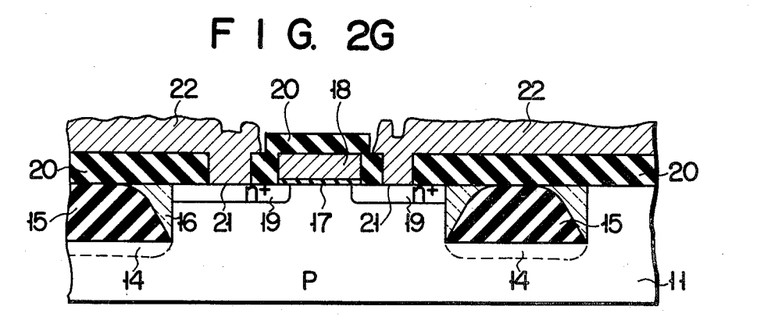

(vii) A gate oxide film 17 and a gate electrode 18 are formed. Then, an n$^+$-type layer 19 is formed as a source or drain. An interlayer insulating film 20 is deposited in which is formed a contact hole 21. An Al wiring layer 22 is then formed to complete the main steps for completing an LSI (FIG. 2G).

Figure 3A:
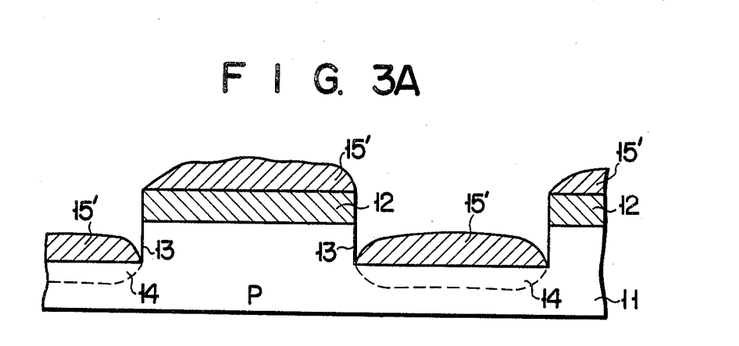
FIGS. 3A to 3D are sectional views showing another embodiment of the method of the present invention.
Figure 3B:
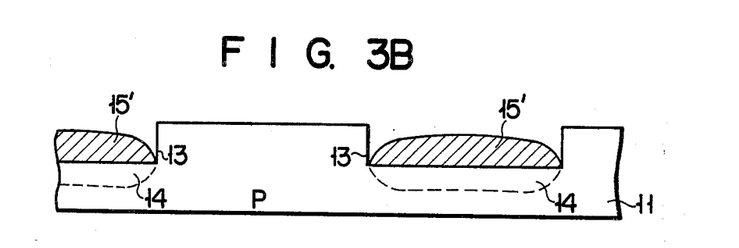

In step (iii) above, the first insulating film 15 of Al$_2$O$_3$, SiO$_2$ or the like is deposited. However, the present invention is not limited to this. For example, an oxidizable material layer may alternatively be formed and oxidized to provide a first insulating film. More specifically, as shown in FIG. 3A, a film 15′ may be formed of a material which has a faster oxidizing rate than the silicon substrate 11 (e.g., aluminum which can be oxidized faster than the silicon substrate by anodic oxidation, or porous silicon which can be oxidized faster than the silicon substrate by thermal oxidation). Then, as shown in FIG. 3B, the resist film 12 is etched away to remove the film 15′ formed thereon and to leave the film 15′ in the groove 13.

Figure 3C:
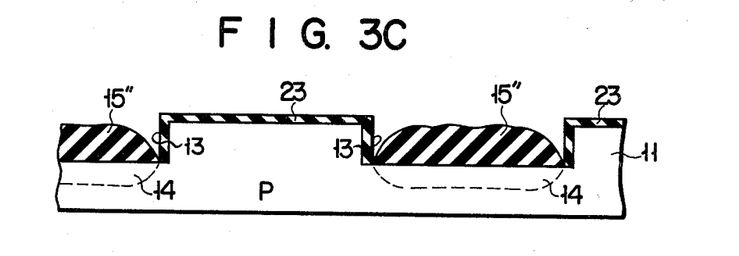

Oxidation is performed such that the film 15′ buried in the groove 13 oxidizes faster than the substrate 11 (e.g., by anodic oxidation if the film 15′ is an Al film, and by thermal oxidation if the film 15′ is a porous silicon film) to convert the film 15′ to an oxide films 15″ (an Al$_2$O$_3$, alumina film if the film 15″ is an Al film and an SiO$_2$ film if the film 15″ is a porous silicon film). During this step, a thin oxide film 23 is also formed on the substrate 11 (FIG. 3C). Since the oxidizing rate of the substrate 11 is smaller than that of the film 15′, the part of the substrate 11 contiguous with the film 15′ is not oxidized much, so that transverse undercutting of the field oxide film (formation of the bird's beak) does not occur.

Figure 3D:
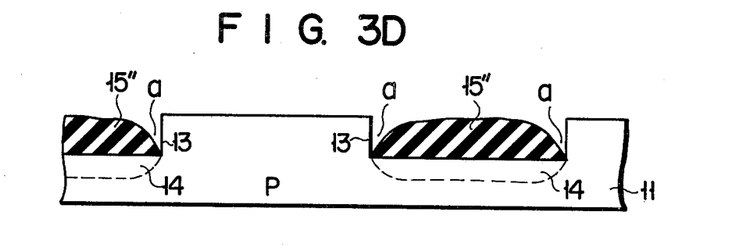

The thin oxide film 23 is etched to expose the substrate 11 and to leave the oxide film 15″ only in the groove 13 (FIG. 3D).

Steps (v) to (vii) are followed without alteration thereafter.

In step (iii) described above, the film 15 is an insulator film of Al$_2$O$_3$ or the like. However, the low melting point insulator as used in step (v) may also be used.

Figure 4:
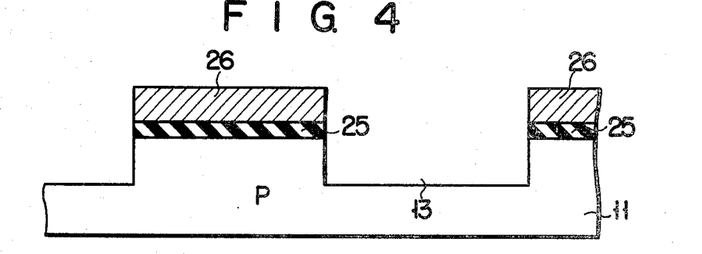
FIGS. 4 to 9 are sectional views showing various modifications of the method of the present invention.

The masking material may be other than the resist film 12 and may, for example as shown in FIG. 4, comprise a bi-layered structure consisting of an SiO$_2$ film 25 and a polycrystalline silicon film 26. In this case, in order to remove the film 15 on the masking material, the polycrystalline silicon film 26 may be etched, leaving the SiO$_2$ film 25.

Before depositing the film 15, a thin insulator film or a thin oxide film (for example, 1,000 Å in thickness) may be formed in the groove 13.

The film 15 may comprise a bi-layered structure of two different materials.

It is also possible to form, below the resist film 12, an antioxidant film, such as an Si$_3$N$_4$ film. This Si$_3$N$_4$ film may be used as a mask during the field oxidation of the film 15 so as to prevent oxidation of the substrate 11.

Figure 5A:
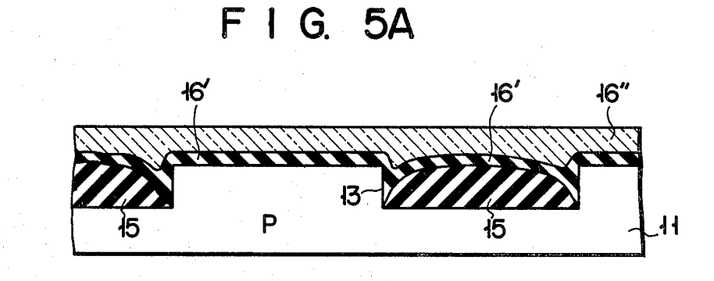
Figure 5B:
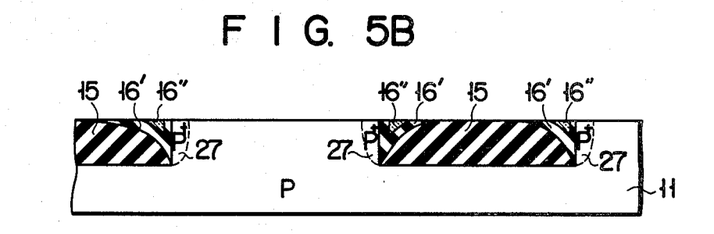

For filling the low melting point insulator into the gap "a" in step (v) described above, an alternative step as shown in FIG. 5A may be performed. First, an insulating layer 16′ (for example, 5,000 Å in thickness) containing an impurity such as boron is deposited. Then, a low melting point insulating layer 16″ (for example, 1 to 2 μm in thickness) is deposited. These two layers are heated at a temperature of for example 1,000° C. for 40 minutes to form a p$^+$-type layer 27 (channel stopper region) by diffusion on both walls of the groove 13 as shown in FIG. 5B. The entire surface of the structure is subjected to etching to leave the insulating layers 16′ and 16″ or to leave only the insulating layer 16′ (in this case the insulating layer 16′ should be deposited relatively thick for instance, 1 μm) in the groove 13.

The diffusion of an impurity to form the p$^+$-type layer 27 may be carried out not necessarily at the melting step of the insulating layers 16′ and 16″, but at any subsequent heating step. The formation of the p$^+$-type layer 27 on each side of the gap "a" may also be conducted by a conventional ion implantation method.

Figure 6:
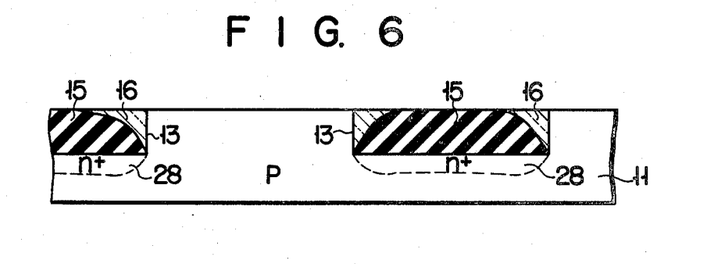

In step (ii), it is also possible to use the resist film 12 as a mask to ion-implant arsenic or phosphorus to form an n$^+$-type wiring layer 28 (a p$^+$-type wiring layer if the ion-implanted impurity is of p-type conductivity) below the field region (FIG. 6).

Figure 7:
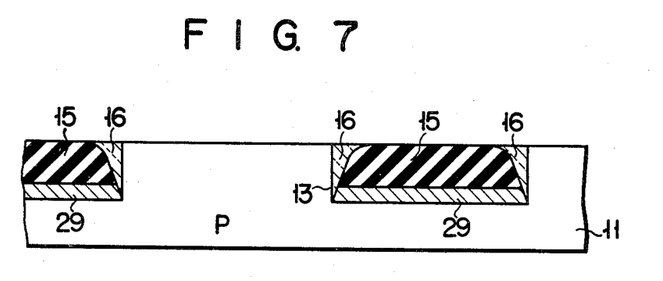

Before depositing the insulating layer in step (iii) described above, it is also possible to deposit a conductive layer 29 of a refractory metal such as molybdenum, silicide, polycrystalline silicon or the like, to deposit the insulating layer 15 thereover, and to treat the structure according to the steps after the etching of the resist film to provide a structure which includes the conductive layer below the field region (FIG. 7).

Figure 8:
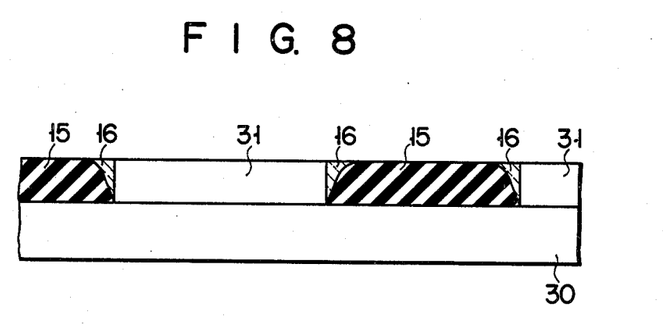

The semiconductor substrate is not limited to that described above but may be a substrate of a p-type silicon substrate, an n-type silicon substrate, or a substrate of a compound such as GaAs, with a monocrystalline semiconductor layer formed thereover by the epitaxial growing method. The semiconductor substrate may be a monocrystalline insulator substrate such as a sapphire substrate or a spinel substrate, with a monocrystalline semiconductor layer formed thereover. Steps (i) to (vii) described above may be adopted without alteration for forming the element isolation region in this case. FIG. 8 shows the case wherein a substrate of composite structure as described above is used. FIG. 8 corresponds to FIG. 2 except that a monocrystalline semiconductor layer 31 is deposited on a first substrate 30 of a compound such as GaAs, p-type silicon, n-type silicon or an insulator such as sapphire. The rest of the configuration in FIG. 8 is the same as shown in FIG. 2, and the same reference numerals denote the same parts and the description thereof will be omitted.

Figure 9:
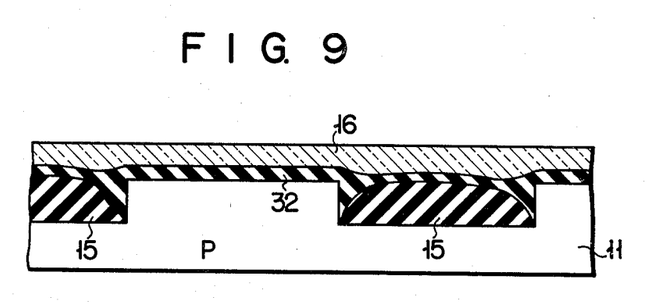

In the embodiment shown in FIGS. 2D and 2E, the low melting point insulator 16 was directly buried in the gap "a". However, the present invention is not limited to this. As shown in FIG. 9, after step (iii), it is also possible to sufficiently fill an insulator 32 such as $Al_2O_3$, $SiO_2$, or the like in the gap "a" by the CVD process and then to fill the gap "a" with the low melting point insulator 16 as in step (iv) described above.

In the above embodiments, the insulating layers 16, 16' and 16" are made flush with the surface of the substrate 11 by means of etching. However, such a flattening step can also be carried out physically by means of abrasion, e.g., after the deposition of $Al_2O_3$, $SiO_2$ and the like.

The embodiment of the present invention has been described with reference to an n-channel structure. However, the present invention is similarly applicable to a p-channel structure. However, it is also possible to use the phosphorus- or arsenic-doped polycrystalline silicon for the film 15 to be deposited over the n-type silicon substrate and to oxidize the film 15 by the wet oxidation (especially when the temperature is 900° C. or lower, the difference in the oxidizing rates of the n-type polycrystalline silicon and the silicon substrate becomes greater.)

In summary, the method of the present invention has various advantages to be described below:

(1) Since the substrate 11 is not oxidized much during the formation of the field oxide film, the bird's beak does not form and the field region of finer pattern may be formed.

(2) The heating period required for the field oxidation may be shortened. When the anodic oxidation is adopted, the heating step is not required in the field oxidation, so that the transverse diffusion of the field channel stopper region 14 may be suppressed to the minimum. If the groove 13 is formed deeper to form a deeper field channel stopper region 14, the channel stopper region 14 may not extend into the element region even if the heat treatment in the field oxidation or in the subsequent steps is prolonged to a certain extent.

(3) Since a recess or gap is not formed between the insulating film 15 or 15" constituting the field region and the side walls of the groove 13, the element isolation layers of excellent characteristics may be formed with a good yield. Furthermore, since the element region and the field region may be flattened, the subsequent photolithography step for forming a fine pattern may be facilitated.

What is claimed is:

1. A method of providing a deep element isolation region in a semiconductor device having a semiconductor substrate during manufacture of the device, comprising the steps of:
    (a) forming a pattern of a masking material on the semiconductor substrate, and forming a groove in said semiconductor substrate by using the patterned masking material as a mask;
    (b1) forming a first insulating film in said groove in such a degree as to leave V-shaped gaps on both sides of said first insulating film, each said gap being surrounded between a side wall of the groove and said first insulating film;
    (b2) removing said masking material together with said first insulating film formed thereon to leave said first insulating film only in said groove;
    (c) forming a second insulating film on the surface of said semiconductor substrate including said groove; and
    (d) forming an isolation region substantially in said groove by removing a surface layer of said second insulating film.

2. A method according to claim 1, wherein said first insulating film in step (b1) consists of a material having an oxidizing rate greater than an oxidizing rate of said semiconductor substrate; and
    oxidizing said first film after step (b2) and before step (c)
    under conditions that the oxidizing rate of said first film left in said groove is greater than the oxidizing rate of said semiconductor substrate so as to form an oxide of said first film.

3. A method according to claim 1, wherein said first insulating film formed in step (b1) is an $Al_2O_3$ film or an $SiO_2$ film.

4. A method according to claim 1, wherein said second insulating film formed in step (c) consists of a low melting point insulator.

5. A method according to claim 4, wherein said semiconductor substrate is of n-type and said low melting point insulator is a member selected from the group consisting of boron phospho-silicate glass, phospho-silicate glass, and arsenic silicate glass.

6. A method according to claim 1, wherein said masking material in step (a) comprises a bi-layered structure.

7. A method according to claim 6, wherein said bi-layered structure consists of a $SiO_2$ film and a polycrystalline silicon film deposited on the $SiO_2$ film, and only the polycrystalline silicon film is removed in the step (b2).

8. A method according to claim 1, wherein said second insulating film is included with an impurity, and channel stopper regions are formed on both walls of the groove after the step (c).

9. A method according to claim 1, wherein the groove-forming step in the step (a) is carried out by a taper etching method.

10. A method according to claim 9, wherein an n- or p-type impurity is ion-implanted to form an $n^+$- or $p^+$-type layer before step (b1) and after step (a).

11. A method according to claim 1, wherein a thin insulating film is formed on a bottom of said groove before step (b1) and after step (a).

12. A method according to claim 1, wherein said first insulating film is a bi-layered structure consisting of two substances.

13. A method according to claim 1, wherein a conductor layer is formed on the upper surface of said semiconductor substrate after step (a), and said conductor layer on said masking layer is etched together with said masking material in step (b2).

14. A method according to claim 13, wherein said conductor layer consists of a material selected from the group consisting of refractory metals, silicides, and polycrystalline silicon.

15. A method according to claim 1, further comprising the steps of depositing a third insulating film containing an n- or p-type impurity before step (c) and after step (b2) and diffusing said impurity toward both sides of said groove in a heating step to follow.

16. A method according to claim 1, wherein an n- or p-type impurity is ion-implanted to form an n+- or p+-type layer before step (b1) and after step (a).

17. A method according to claim 16, wherein said n+- or p+-type layer is a channel stopper layer.

18. A method according to claim 16, wherein said n+- or p+-type layer is a wiring layer.

19. A method of providing a deep element isolation region in a semiconductor device having a semiconductor substrate during manufacture of the device, comprising the steps of:
   forming a pattern of a masking material on the semiconductor substrate, and forming a groove in said semiconductor substrate by using the patterned masking material as a mask;
   forming a first insulating film in said groove in such a degree as to leave V-shaped gaps on both sides of said first insulating film, each said gap being surrounded between a side wall of the groove and the first insulating film;
   removing said masking material together with said first insulating film formed thereon to leave said first insulating film only in said groove;
   forming a second insulating film on the surface of said semiconductor substrate including said groove;
   forming a third insulating film over the second insulating film; and
   forming an isolation region substantially in said groove by removing a surface layer of said second and third insulating films.

20. A method according to any one of claims 1, 2 and 5 to 19, wherein said semiconductor substrate is of a bi-layered structure consisting of an n- or p-type silicon substrate and a monocrystalline semiconductor layer formed thereover.

21. A method according to any one of claims 1, 2 and 5 to 19, wherein said semiconductor substrate is of a bi-layered structure consisting of a compound semiconductor substrate and a monocrystalline semiconductor layer formed thereover.

22. A method according to any one of claims 1, 2 and 5 to 19, wherein said semiconductor substrate is formed on an insulating substrate.

23. A method according to any one of claims 1, 2 and 5 to 19, wherein the step of forming said first insulating film is carried out in such a manner that the sides of said first insulating film are slanted, forming a gap between each of the side walls of said groove and the slanted side of said first insulating film.

24. A method according to any one of claims 1, 2 and 5 to 19, wherein the semiconductor substrate is of n-type.

25. A method according to any one of claims 1, 2 and 5 to 19, wherein the semiconductor substrate is of p-type.

26. A method according to claim 1, wherein the step (b2) comprises a step of etching said masking material together with said first insulating film formed thereon to leave said first insulating film only in said groove.

* * * * *

UNITED STATES PATENT AND TRADEMARK OFFICE
CERTIFICATE OF CORRECTION

PATENT NO. : 4,419,813
DATED : December 13, 1983
INVENTOR(S) : Hiroshi Iwai

It is certified that error appears in the above-identified patent and that said Letters Patent is hereby corrected as shown below:

Claims 20-25 should be cancelled to appear as shown below.

20. A method according to any one of claims 1, "2 and 5 to 19," —2, 5, 6, and 11 to 19,— wherein said semiconductor substrate is of a bi-layered structure consisting of an n- or p-type silicon substrate and a monocrystalline semiconductor layer formed thereover.

21. A method according to any one of claims 1, "2 and 5 to 19," —2, 5, 6, and 11 to 19,— wherein said semiconductor substrate is of a bi-layered structure consisting of a compound semiconductor substrate and a monocrystalline semiconductor layer formed thereover.

22. A method according to any one of claims 1, "2 and 5 to 19," —2, 5, 6, and 11 to 19,— wherein said semiconductor substrate is formed on an insulating substrate.

23. A method according to any one of claims 1, "2 and 5 to 19," —2, 5, 6, and 11 to 19,— wherein the step of forming said first insulating film is carried out in such a manner that the sides of said first insulating film are slanted, forming a gap between each of the side walls of said groove and the slanted side of said first insulating film.

24. A method according to any one of claims 1, "2 and 5 to 19," —2, 5, 6, and 11 to 19,— wherein the semiconductor substrate is of n-type.

25. A method according to any one of claims 1, "2 and 5 to 19," —2, 5, 6, and 11 to 19,— wherein the semiconductor substrate is of p-type.

Signed and Sealed this

First Day of May 1984

[SEAL]

Attest:

GERALD J. MOSSINGHOFF

Attesting Officer     Commissioner of Patents and Trademarks